US008461047B2

(12) United States Patent
Ishikawa et al.

(10) Patent No.: US 8,461,047 B2
(45) Date of Patent: Jun. 11, 2013

(54) METHOD FOR PROCESSING AMORPHOUS CARBON FILM, AND SEMICONDUCTOR DEVICE MANUFACTURING METHOD USING THE METHOD

(75) Inventors: Hiraku Ishikawa, Sendai (JP); Takaaki Matsuoka, Tokyo (JP)

(73) Assignee: Tokyo Electron Limited (JP)

( * ) Notice: Subject to any disclaimer, the term of this patent is extended or adjusted under 35 U.S.C. 154(b) by 174 days.

(21) Appl. No.: 12/863,362

(22) PCT Filed: Jan. 9, 2009

(86) PCT No.: PCT/JP2009/050192
§ 371 (c)(1),
(2), (4) Date: Jul. 16, 2010

(87) PCT Pub. No.: WO2009/090912
PCT Pub. Date: Jul. 23, 2009

(65) Prior Publication Data
US 2011/0053375 A1    Mar. 3, 2011

(30) Foreign Application Priority Data
Jan. 18, 2008    (JP) .................................. 2008-009504

(51) Int. Cl.
*H01L 21/00*    (2006.01)
(52) U.S. Cl.
USPC ........... 438/693; 438/723; 438/726; 438/737; 438/740; 257/E21.008; 257/E21.257
(58) Field of Classification Search
USPC .................. 438/396, 693–740; 257/E21.008, 257/257
See application file for complete search history.

(56) References Cited

U.S. PATENT DOCUMENTS

| | | | | |
|---|---|---|---|---|
| 5,072,289 A | * | 12/1991 | Sugimoto et al. | 257/737 |
| 5,139,610 A | * | 8/1992 | Dunaway et al. | 438/674 |
| 5,207,585 A | * | 5/1993 | Byrnes et al. | 439/66 |
| 5,397,997 A | * | 3/1995 | Tuckerman et al. | 324/750.09 |
| 5,468,681 A | * | 11/1995 | Pasch | 438/108 |
| 5,889,327 A | * | 3/1999 | Washida et al. | 257/737 |
| 5,929,521 A | * | 7/1999 | Wark et al. | 257/737 |
| 6,072,236 A | * | 6/2000 | Akram et al. | 257/698 |
| 6,448,665 B1 | * | 9/2002 | Nakazawa et al. | 257/789 |
| 6,461,881 B1 | * | 10/2002 | Farnworth et al. | 438/15 |

(Continued)

FOREIGN PATENT DOCUMENTS

| | | | |
|---|---|---|---|
| CN | 1981375 A | * | 12/2004 |
| JP | 2002-012972 | | 1/2002 |

(Continued)

OTHER PUBLICATIONS

Korean Office Action—Korean Application No. 10-2010-7015462 issued on Jul. 12, 2011, citing KR 10-0810163, KR 10-0486087, and KR 10-0566472.

(Continued)

*Primary Examiner* — Michael Lebentritt
(74) *Attorney, Agent, or Firm* — Cantor Colburn LLP

(57) ABSTRACT

A method for processing an amorphous carbon film which has been formed on a substrate and wet-cleaned after being dry-etched includes preparing the substrate having the wet-cleaned amorphous carbon film and modifying a surface of the amorphous carbon film, before forming an upper layer on the wet-cleaned amorphous carbon film.

8 Claims, 8 Drawing Sheets

U.S. PATENT DOCUMENTS

| | | | | |
|---|---|---|---|---|
| 6,513,236 B2 * | 2/2003 | Tsukamoto | ............... | 29/846 |
| 6,521,995 B1 * | 2/2003 | Akram et al. | ............... | 257/737 |
| 6,525,413 B1 * | 2/2003 | Cloud et al. | ............... | 257/686 |
| 6,617,687 B2 * | 9/2003 | Akram et al. | ............... | 257/737 |
| 6,780,746 B2 * | 8/2004 | Kinsman et al. | ............... | 438/612 |
| 7,129,576 B2 * | 10/2006 | Humpston | ............... | 257/704 |
| 7,221,045 B2 * | 5/2007 | Park et al. | ............... | 257/676 |
| 7,394,663 B2 * | 7/2008 | Yamashita et al. | ............... | 361/766 |
| 7,728,431 B2 * | 6/2010 | Harada et al. | ............... | 257/750 |

FOREIGN PATENT DOCUMENTS

| | | |
|---|---|---|
| JP | 2006-049798 | 2/2006 |
| KR | 10-0486087 | 4/2005 |
| KR | 10-0566472 | 3/2006 |
| KR | 10-0810163 | 2/2008 |
| WO | WO 2008/004584 A1 * | 4/2007 |
| WO | 2008/004584 | 1/2008 |

OTHER PUBLICATIONS

International Search Report—PCT/JP2009/050192 dated Mar. 31, 2009.

Chinese Office Action—Chinese Application No. 200980102550.1 issued on Oct. 17, 2011, citing CN 1981375 and WO 2008/004584.

\* cited by examiner

METHOD FOR PROCESSING AMORPHOUS CARBON FILM, AND SEMICONDUCTOR DEVICE MANUFACTURING METHOD USING THE METHOD

TECHNICAL FIELD

The present invention relates to a method for processing an amorphous carbon film which is suitable for a mask or the like when a semiconductor device is manufactured, a semiconductor device manufacturing method using the method.

BACKGROUND ART

In a semiconductor device, an interlayer insulation film is formed between wiring layers. In the conventional art, a $SiO_2$ film has been used as such an interlayer insulation film. However, due to recent continuous demands for higher rate of semiconductor devices, a relatively low-permittivity film is demanded. For example, such a low-permittivity interlayer insulation film (low-k film) is formed of a Si based organic material containing Si, O, and C.

However, since such a Si based low-k film is expensive and has difficulties in performing etching thereon with high selectivity with respect to other films, low-k films which address the above problems are being required.

An amorphous carbon film to which hydrogen is added is being considered as a material without such problems. As illustrated in Japanese Laid-Open Patent Publication No. 2002-12972 (patent document 1), an amorphous carbon film can be formed through CVD by using hydrocarbon gas as a process gas, is inexpensive, and does not cause the problems which may be caused by the Si based low-k film.

Also, the patent document 1 discloses that the amorphous carbon film is used for various purposes such as a replacement for a resist film corresponding to a lower layer in multi-layered resist, an anti-reflective layer, or the like.

However, when the amorphous carbon film is used as the interlayer insulation film, after forming the amorphous carbon film, dry-etching is performed on a trench and a via portion in a damascene process, and then, wet-cleaning is performed to remove deposition materials generated during the etching process. At this time, side wall portions of the dry-etched amorphous carbon film are subjected to etching damages, and are oxidized relatively easily by moisture or the like during the wet-cleaning, and thus, a hydroxyl group (an OH group) is formed. In addition, due to an oxidation operation by the formed OH group, film characteristics of the amorphous carbon film are deteriorated, e.g., adhesion between the amorphous carbon film and a film formed on the amorphous carbon film may be deteriorated or a permittivity of the amorphous carbon film increases.

Patent Document 1

Japanese Laid-Open Patent Publication No. 2002-12972

DISCLOSURE OF THE INVENTION

Technical Problem

The present invention provides a method for processing an amorphous carbon film, which can prevent the amorphous carbon film from deteriorating due to oxidation when the amorphous carbon film after being etched is wet-cleaned.

The present invention also provides a semiconductor device manufacturing method using the method for processing amorphous carbon film.

Technical Solution

According to a first aspect of the present invention, there is provided a method for processing an amorphous carbon film which has been formed on a substrate and wet-cleaned after being dry-etched, the method including: preparing the substrate having the wet-cleaned amorphous carbon film; and modifying a surface of the amorphous carbon film, before forming an upper layer on the wet-cleaned amorphous carbon film.

According to a second aspect of the present invention, there is provided a semiconductor device manufacturing method including: forming an interlayer insulation film including an amorphous carbon film on a semiconductor substrate; forming a hole or a trench by performing dry-etching on the interlayer insulation film; performing a wet-cleaning process on the interlayer insulation film on which the dry-etching has been performed; performing a surface modification process on the amorphous carbon film after the wet-cleaning process is performed; forming a barrier film as an upper layer of the amorphous carbon film after the surface modification process is performed; and burying a wiring metal in the hole or the trench.

In the first and second aspects of the present invention, the modifying of the surface may be a silylation process for bringing a silylating agent into contact with the amorphous carbon film. The silylation process may be performed by bringing vapor of the silylating agent into contact with the surface of the amorphous carbon film. In this case, the silylation process may be performed at a temperature within a range of room temperature to 200° C.

Also, in the first and second aspects of the present invention, the silylating agent may be preferably one or at least two selected from the group consisting of HMDS (Hexamethyldisilazane), DMSDMA (Dimethylsilyldimethylamine), TMSDMA (Trimethylsilyldimethylamine), TMDS (1,1,3,3-Tetramethyldisilazane), TMSPyrole (1-Trimethylsilylpyrole), BSTFA (N,O-Bis(trimethylsilyl)trifluoroacetamide), and BDMADMS (Bis(dimethylamino)dimethylsilane).

Also, in the first or second aspect of the present invention, the surface modification process may be a process for bringing a silicon hydride gas into contact with the amorphous carbon film.

In addition, in the first or second aspect of the present invention, the method may preferably further include removing an oxide film from the surface of the wet-cleaned amorphous carbon film, before modifying the surface of the amorphous carbon film.

According to a third aspect of the present invention, there is provided a computer readable storage medium having recorded thereon a program for operating on a computer and controlling a processing apparatus, wherein the program controls the processing apparatus in the computer so as to execute a method for processing an amorphous carbon film, the method includes: preparing the substrate having the wet-cleaned amorphous carbon film; and modifying a surface of the amorphous carbon film, before forming an upper layer on the wet-cleaned amorphous carbon film.

Advantageous Effects

According to the present invention, a surface modification process is performed with respect to an amorphous carbon film wet-cleaned after being dry-etched, before forming an upper layer of the amorphous carbon film, and thus, the surface of the amorphous carbon film, which has been damaged by the dry-etching and includes a hydroxyl group (an OH group) formed by the wet-cleaning, can be modified, deterioration of adhesion between the amorphous carbon film and a film formed thereon can be prevented, and permittivity of the amorphous carbon film, which is increased due to the OH group, can be recovered. In particular, since a silylation process is performed as the surface modification process so that the hydroxyl group formed on the surface of the amorphous carbon film are replaced with a silyl group, the deterioration of the adhesion with a metal film of the upper layer on the amorphous carbon film or the increase of the permittivity of the amorphous carbon film may be very effectively prevented.

BEST MODE FOR CARRYING OUT THE INVENTION

Hereinafter, embodiments of the present invention will be described in detail with reference to accompanying drawings.

Figure 1:
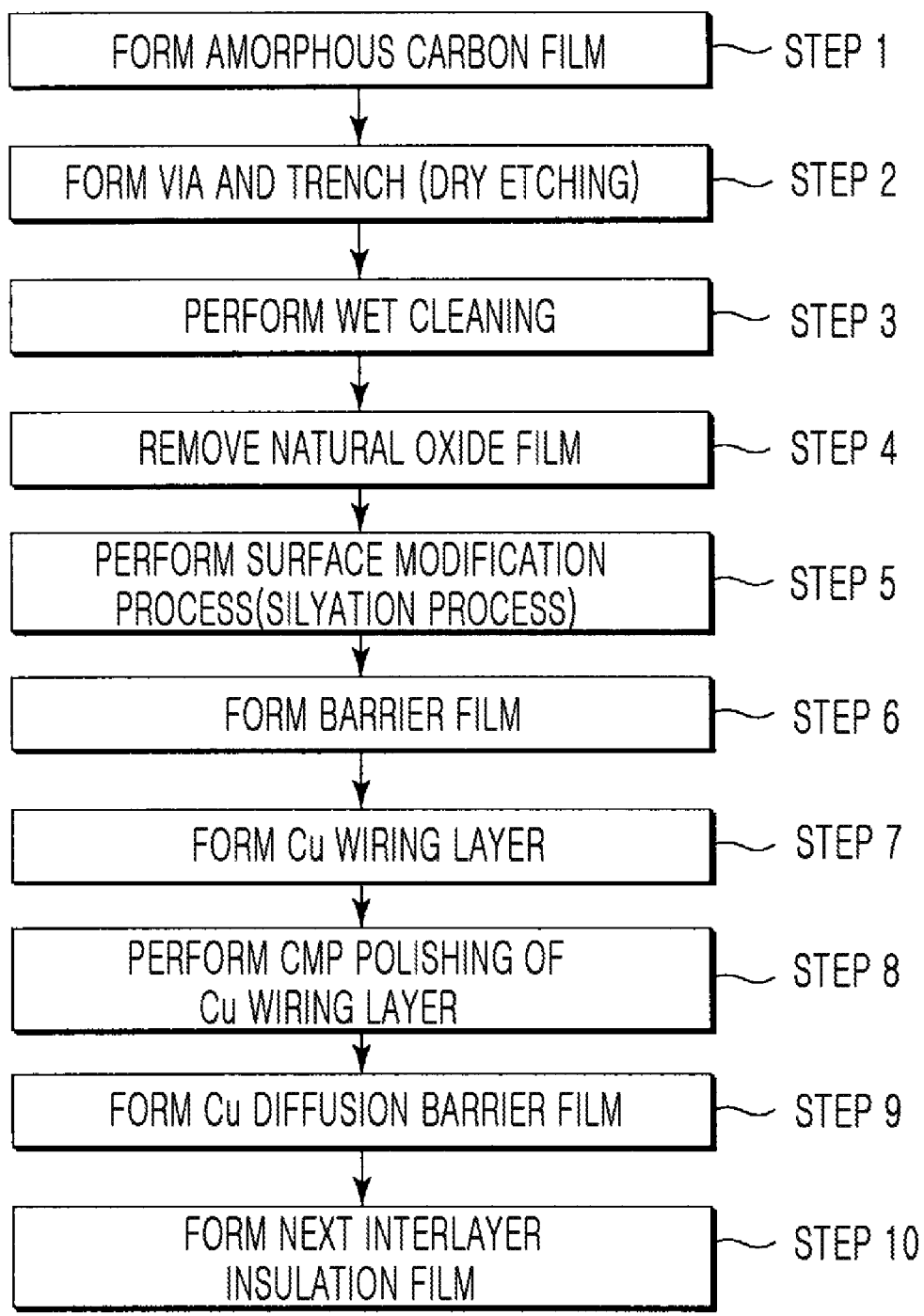
FIG. 1 is a flowchart showing a series of operations of a semiconductor device manufacturing method including an amorphous carbon film processing method according to an embodiment of the present invention.
Figure 2:
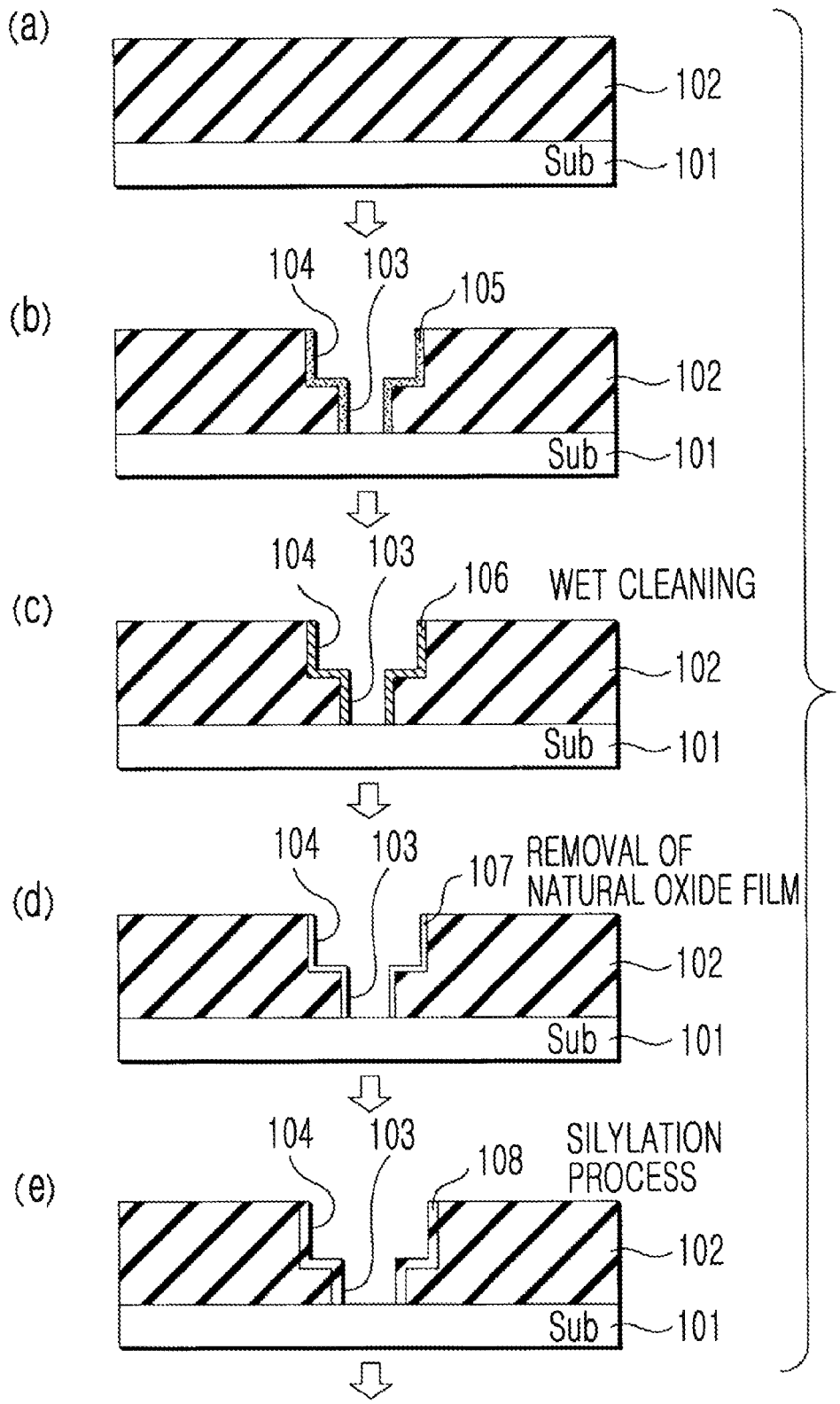
FIG. 2 is a cross-sectional view showing processes ended with a surface modification process for an amorphous carbon film in the semiconductor device manufacturing method including the amorphous carbon film processing method according to the embodiment of the present invention.
Figure 3:
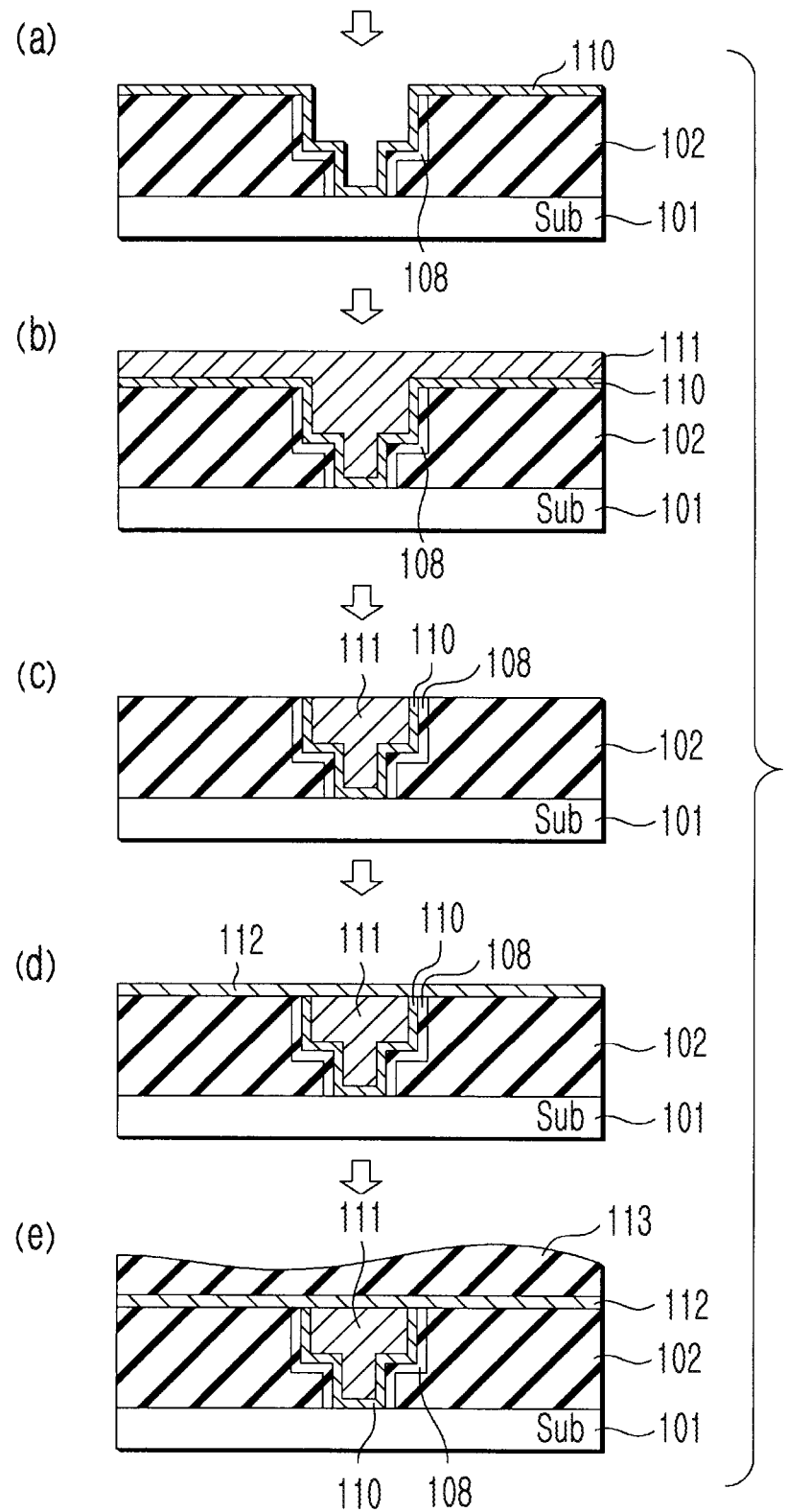
FIG. 3 is a cross-sectional view showing processes subsequent to the surface modification process for the amorphous carbon film in the semiconductor device manufacturing method including the amorphous carbon film processing method according to the embodiment of the present invention.

FIG. 1 is a flowchart showing a series of processes of a semiconductor device manufacturing method including an amorphous carbon film processing method according to an embodiment of the present invention, and FIGS. 2 and 3 are cross-sectional views showing the processes of the semiconductor device manufacturing method.

According to the present embodiment, first an amorphous carbon film 102 is formed as an interlayer insulation film on a silicon substrate (semiconductor wafer) 101 (step 1, FIG. 2(a)). Although a method of forming the amorphous carbon film 102 is not limited to a certain method, the amorphous carbon film 102 may be preferably formed by CVD, which will be described later. At this time, a hydrocarbon gas, such as propylene ($C_3H_6$), propine ($C_3H_4$), propane ($C_3H_8$), butane ($C_4H_{10}$), butylene ($C_4H_8$), butadiene ($C_4H_6$), acetylene ($C_2H_2$), or the like, or a gas based on any of these compounds may be used as a process gas. In addition, strong carbon networks may be formed even in film formation at a relatively low temperature by adding oxygen to a process gas.

After forming the amorphous carbon film 102, the amorphous carbon film 102, which is the interlayer insulation film, is dry-etched to form a hole 103 and a trench 104 (step 2, FIG. 2(b)). In more detail, first, via etching is performed by using a resist layer (not shown) or the like as a mask to remove a resist, then a sacrificial layer (not shown) is formed, trench etching is performed by using a resist layer as a mask, and then, the resist is removed again to perform dry-ashing and the sacrificial layer and a stopper layer (not shown) are removed by etching to form the hole 103 and the trench 104. At this time, a damage layer 105 is formed in the amorphous carbon film 102 due to the etching or the ashing.

After performing the step 2, wet-cleaning is performed in a general way (step 3, FIG. 2(c)). The damage layer 105 is relatively easily oxidized due to moisture during the wet-cleaning, and thus, the damage layer 105 becomes a natural oxide film 106 having an OH group.

Next, if necessary, the natural oxide film 106 on the surface of the amorphous carbon film 102 is removed (step 4, FIG. 2(d)). The natural oxide film may be removed using a plasma treatment, a treatment using a reduction gas such as $H_2$ gas or the like, a COR process using ammonia gas and hydrogen fluoride gas, or other processes. However, although the natural oxide film is removed by the above method, a deformed layer 107 on which the OH group exists remains on the surface of the amorphous carbon film 102.

If a portion having the OH group such as the natural oxide film 106 or the deformed layer 107 remains on the surface of the amorphous carbon film 102, a metal film that will be formed later may be oxidized, or a permittivity of the amorphous carbon film 102 is increased, thereby deteriorating quality of film.

Thus, next, before forming an upper layer on the amorphous carbon film 102, a surface modification process is performed with respect to the amorphous carbon film 102, and then, a surface-modified layer 108 is formed (step 5, FIG. 2 (e)). As described above, since the surface of the amorphous carbon film 102 is modified in order to substitute the OH group on the surface of the amorphous carbon film 102 with different group, the oxidation may be reduced, and thus, degradation of adhesion between the amorphous carbon film 102 and a film formed on the amorphous carbon film may be prevented. In addition, the permittivity of the amorphous carbon film 102 that is increased due to the OH group may be recovered.

The above surface process may be, for example, a silylation process. The silylation process is a process of reacting the OH group formed on the surface of the amorphous carbon film 102 with a silylating agent to substitute the OH group with a silyl group such as a trimethylsilyl group or the like. Accordingly, the surface of the amorphous carbon film is modified so that the surface-modified layer 108 is formed.

The silylating agent may be any kind of material as long as it generates a silylation reaction. However, the silylating agent may be preferably a compound having a relatively small molecular structure from among a group of compounds having silazane bonds (Si—N bonds) in molecules. In more detail, for example, HMDS (Hexamethyldisilazane), DMS-DMA (Dimethylsilyldimethylamine), TMSDMA (Trimethylsilyldimethylamine), TMDS (1,1,3,3-Tetramethyldisilazane), TMSPyrole (1-Trimethylsilylpyrole), BSTFA (N,O-Bis(trimethylsilyl)trifluoroacetamide), BDMADMS (Bis(dimethylamino)dimethylsilane), and the like may be used as the silylating agent. Chemical formulas of the above compounds are as follows.

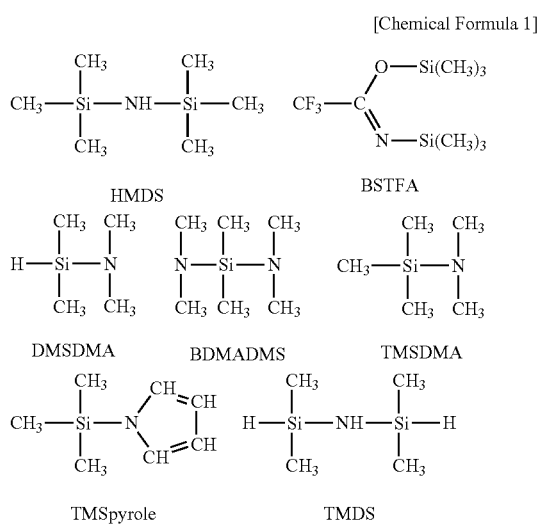

[Chemical Formula 1]

The silylation reaction when DMSDMA is used as the silylating agent may be represented as the following chemical formula 2, for example, and the OH group in the film is substituted by an O—Si type.

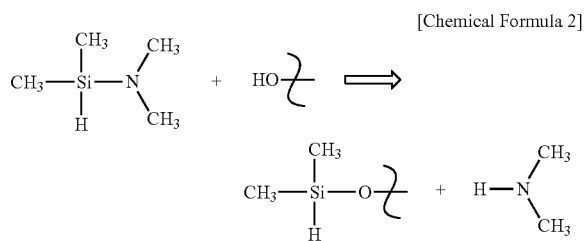

[Chemical Formula 2]

The silylation process may be performed by bringing the silylating agent into contact with the amorphous carbon film, and typically, the surface of the amorphous carbon film is exposed to the vapor of the silylating agent, which will be described later. Furthermore, silylation process may be performed by coating the silylating agent on the surface of the amorphous carbon film.

After the silylation process according to the present embodiment is performed with respect to the amorphous carbon film 102 as described above, a barrier film 110 is formed as the upper layer on the amorphous carbon film (step 6, FIG. 3(a)).

Next, the hole 103 and the trench 104 are filled by Cu plating to form a Cu wiring layer 111 (step 7, FIG. 3(b)). In addition, the formed Cu wiring layer 111 is polished by CMP (Chemical Mechanical Polishing) (step 8, FIG. 3(c)). In order to improve characteristics of a semiconductor device to be obtained, a natural oxide film on a surface of the Cu wiring layer 111 may be preferably removed.

Next, a Cu-diffusion barrier film 112 such as a SiN film or the like is formed on the Cu wiring layer 111 and the amorphous carbon film 102 (step 9, FIG. 3(d)). After that, another interlayer insulation film 113 is formed on the Cu-diffusion barrier film 112 (step 10, FIG. 3(e)). A hole and a trench are also formed in the interlayer insulation film 113 by a dual damascene process, similar to the amorphous carbon film as the interlayer insulation film, and then, are filed by a Cu wiring layer. These processes are repeated a predetermined number of times to manufacture a semiconductor device having a multi-layered copper wiring structure.

Figure 4:
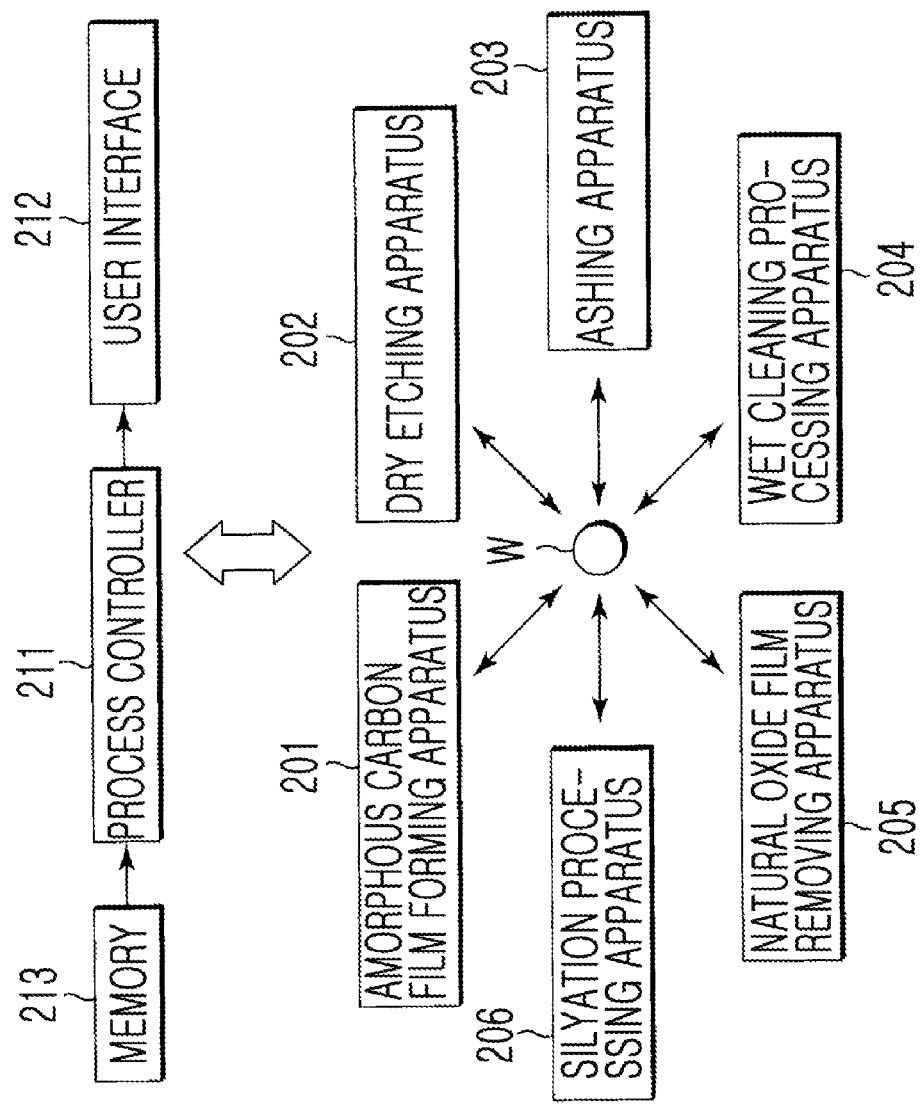
FIG. 4 is a block diagram showing a group of processing apparatuses for performing a series of processes before the surface modification process of the amorphous carbon film from among the processes of manufacturing the semiconductor device.

Next, a group of processing apparatuses for performing a series of processes ended with the surface modification process of the amorphous carbon film corresponding to the step 5 shown in FIG. 1 according to the present embodiment, will be described. FIG. 4 is a block diagram of the group of processing apparatuses for performing the series of processes. The group of processing apparatuses includes an amorphous carbon film forming apparatus 201 for forming the amorphous carbon film, a dry etching apparatus 202 for dry-etching the amorphous carbon film formed on a semiconductor wafer W, an ashing apparatus 203 for ashing resist films and the like after the etching process, a cleaning processing apparatus 204 for performing a wet-cleaning process after the etching and ashing processes, a natural oxide film removal apparatus 205 for removing the natural oxide film formed on the surface of the amorphous carbon film after the wet-cleaning process, and a silylation processing apparatus 206 for performing the silylation process, which is a surface modification process, on the amorphous carbon film after wet-cleaning the amorphous carbon film or removing the natural oxide film. In addition, the semiconductor wafer W may be transferred between the processing apparatuses by using a transfer apparatus (not shown). The semiconductor wafer W may be transferred by an operator instead of using the transfer apparatus. In addition, the amorphous carbon film forming apparatus 201 and the silylation processing apparatus 206 in the above group of processing apparatuses will be described later, while descriptions of the other apparatuses are not provided since typical apparatuses may be used as the other apparatuses.

These processing apparatuses are configured to be batch-controlled by a process controller 211 including a micro processor (computer). A user interface 212 which includes a keyboard for performing command input and the like since an operator manages each of the processing apparatuses, a display for visually displaying operating conditions of each of the processing apparatuses and the like, and a memory 213 which stores control programs for realizing various processes performed by each of the processing apparatuses under the control of the process controller 211 or a processing recipe in which processing condition data and the like are recorded are connected to the process controller 211. The recipe is recorded in a storage medium in the memory 213. The storage medium may be a fixed medium such as a hard disk or the like, or a portable medium such as a CD-ROM, DVD, a flash memory, or the like. Also, the recipe may be suitably transmitted from another apparatus through, for example, a dedicated line.

In addition, if necessary, a certain recipe is loaded from the memory 213 and executed in the process controller 211 in response to commands from the user interface 212, and thus, a series of desired processes may be performed in the group of processing apparatuses under the control of the process controller 211.

Figure 5:
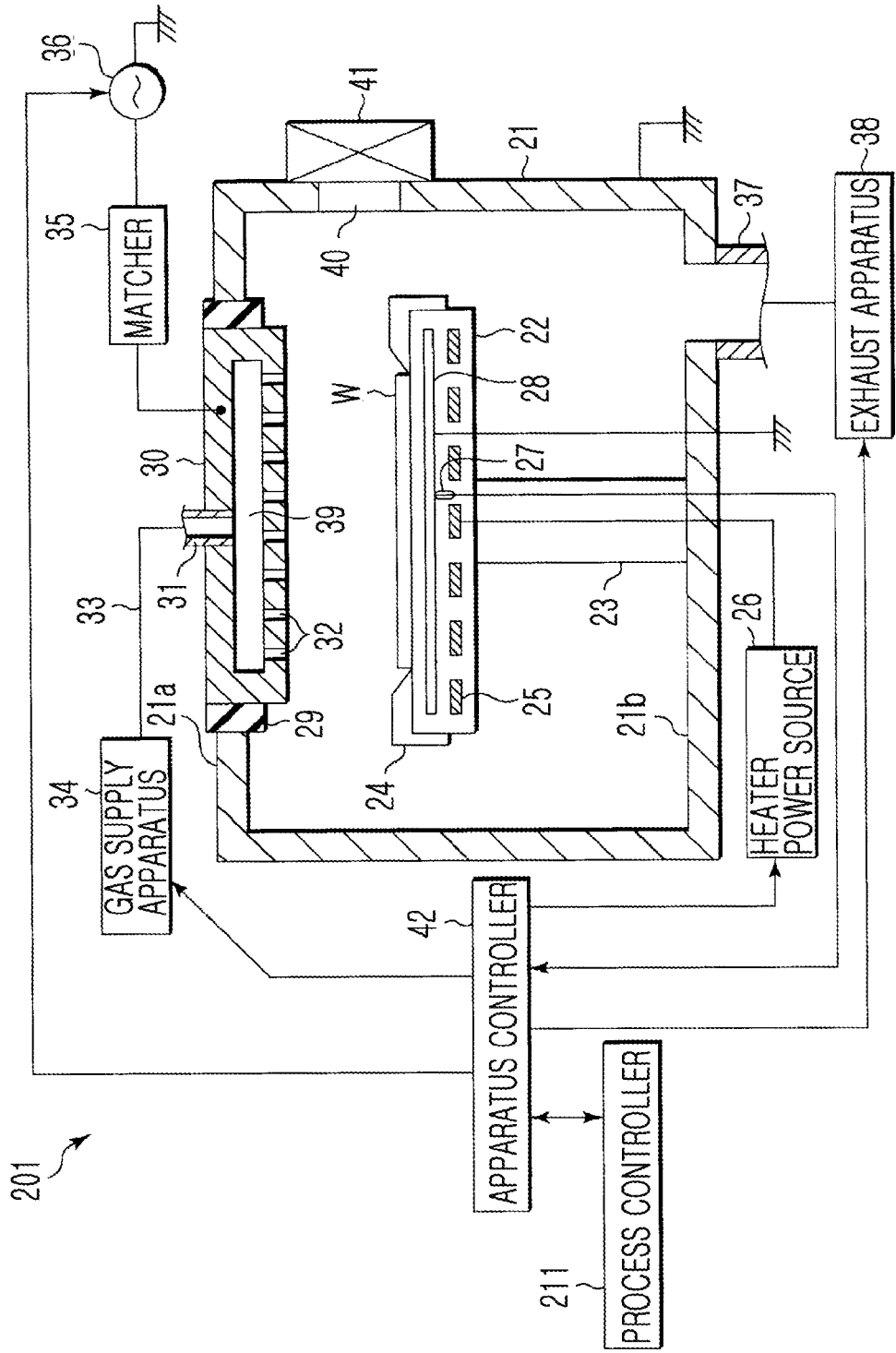
FIG. 5 is a schematic cross-sectional view of a structure of an amorphous carbon film forming apparatus included in the group of processing apparatuses shown in FIG. 4.

Next, the amorphous carbon film forming apparatus 201 will be described in detail. FIG. 5 is a cross-sectional view of the amorphous carbon film forming apparatus 201 for the amorphous carbon film according to the present embodiment.

The amorphous carbon film forming apparatus 201 includes a chamber 21 that has an almost cylindrical shape. In the chamber 21, a susceptor 22 for horizontally supporting the semiconductor wafer W that is an object to be processed is supported by a cylindrical supporting member 23 that is formed on a central lower portion of the susceptor 22, and the susceptor 22 is disposed in that way. A guide ring 24 for guiding the semiconductor wafer W is formed on an outer edge portion of the susceptor 22. In addition, heaters 25 are buried in the susceptor 22 and heat the semiconductor wafer W, which is a substrate to be processed, to a predetermined temperature by being supplied with electricity from a heater power source 26. A thermocouple 27 is buried in the susceptor 22 so that an output to the heaters 25 is controlled by a detection signal of the thermocouple 27. An electrode 28 is buried around a surface of the susceptor 22, and is grounded. In addition, three wafer supporting pins (not shown) for supporting and elevating the semiconductor wafer W are formed in the susceptor 22 to project from and be dented in the surface of the susceptor 22.

A shower head 30 is formed on a top wall 21a of the chamber 21 via an insulating member 29. The shower head 30 has a cylindrical shape having a gas diffusion space 39 therein, and includes a gas inlet 31 for introducing a process gas, which is formed in an upper surface of the shower head 30, and a plurality of gas outlets 32 formed in a lower surface thereof. A gas supply apparatus 34 for supplying the process gas used to form the amorphous carbon film is connected to the gas inlet 31 of the shower head 30 via a gas pipe 33.

A radio frequency (RF) power supply source 36 is connected to the shower head 30 via a matcher 35 so that RF power is supplied to the shower head 30 from the RF power supply source 36. By supplying the RF power from the RF power supply source 36, the gas supplied into the chamber 21 via the shower head 30 may be plasmatized.

An exhaust pipe 37 is connected to a bottom wall 21b of the chamber 21, and an exhaust apparatus 38 including a vacuum pump 59 is connected to the exhaust pipe 37. In addition, an inner space of the chamber 21 can be depressurized to a predetermined vacuum degree by operating the exhaust apparatus 38. A transfer-from/transfer-to outlet 40 for transferring from and transferring to the semiconductor wafer W, and a gate valve 41 for closing/opening the transfer-from/transfer-to outlet 40 are formed in a side wall of the chamber 21.

Components of the amorphous carbon film forming apparatus 201, for example, the heater power source 26, the gas supply apparatus 34, the RF power supply source 36, and the exhaust apparatus 38 and the like, are connected to an apparatus controller 42, and the apparatus controller 42 is connected to the process controller 211. In addition, each of the components of the amorphous carbon film forming apparatus 201 is controlled by the apparatus controller 42 based on commands of the process controller 211.

In the amorphous carbon film forming apparatus 201 configured as above, first, the semiconductor wafer W is transferred into the chamber 21 and loaded on the susceptor 22. In addition, while a plasma generating gas, for example, Ar gas, is supplied from the gas supply apparatus 34 through the gas pipe 33 and the shower head 30, an inner space of the chamber 21 is evacuated by using the exhaust apparatus 38 to maintain the inside of the chamber 21 in a depressurized state, and also, the heaters 25 heat the susceptor 22 to a predetermined temperature, for example, about 100° C. to about 200° C. In addition, the RF power supply source 36 applies RF power to the shower head 30 so that an RF electric field is generated between the shower head 30 and the electrode 28 and thus the process gas is plasmatized.

In the above status, a process gas including hydrocarbon gas used to form an amorphous carbon film is supplied from the gas supply apparatus 34 into the chamber 21 through the gas pipe 33 and the shower head 30.

Accordingly, the process gas is excited by the plasma generated in the chamber 21, and at the same time, heated and decomposed on the semiconductor wafer W to form the amorphous carbon film having a predetermined thickness.

The process gas including hydrocarbon gas may be a gas in which acetylene and hydrogen gas are mixed. In addition, a gas represented by a chemical formula $C_4H_6$ may be used as the process gas. In more detail, for example, 2-butyne or butadiene may be used as the process gas. Also, an inert gas such as Ar gas or the like may be used as the process gas. In addition, a pressure in the chamber during film formation may be preferably 2.7 Pa (20 mTorr) or less.

In addition, a semiconductor wafer temperature (a film-formation temperature) when the amorphous carbon film is formed may be preferably 200° C. or less, more preferably, in a range of 100° C. to 200° C.

Frequency and power of the RF power applied to the shower head 30 may be appropriately set according to a required reaction. As described above, since the RF electric field may be generated in the chamber 21 and thus the process gas may be plasmatized due to application of the RF power, the amorphous carbon film may be formed by plasma CVD. Since the plasmatized gas has high reactivity, the film-formation temperature can be lowered. In addition, the plasma source is not limited to a capacitively coupled plasma type using the RF power, and may be inductively coupled plasma or may be micro waves introduced into the chamber 21 via a waveguide and an antenna to generate plasma. In addition, generation of the plasma is not an essential process, that is, film formation may be performed by thermal CVD when the reactivity is sufficiently high.

The amorphous carbon film formed by the above processes is a $CH_x$ film formed of carbon and hydrogen ($0.8<x<1.2$), and has a permittivity of about 2.7 that is slightly higher than the permittivity of the conventional low-k film, and thus, may be used as an interlayer insulation film having a sufficiently low permittivity. In addition, the amorphous carbon film has a high barrier property against diffusion of Cu.

Figure 6:
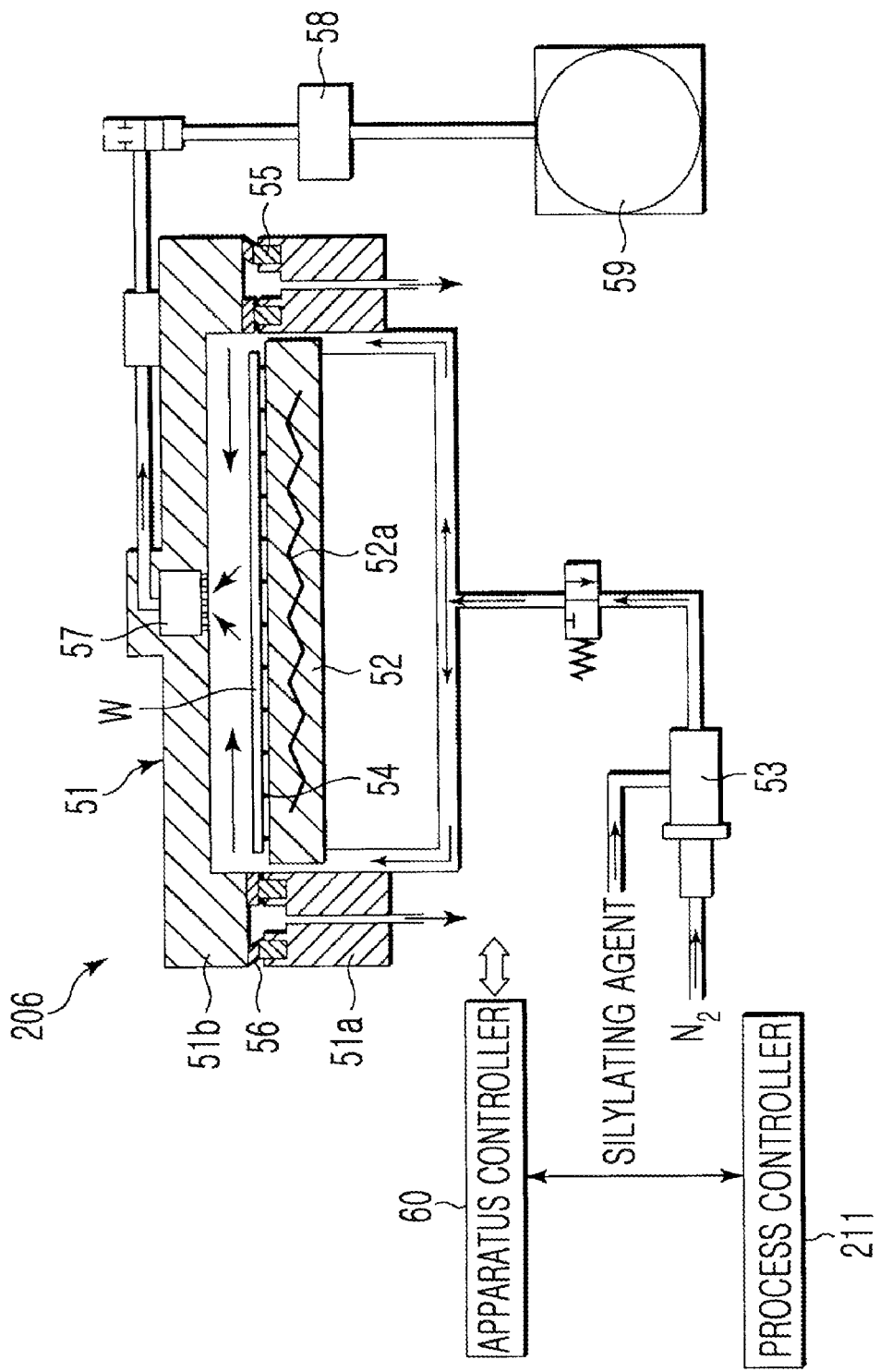
FIG. 6 is a schematic cross-sectional view of a structure of a silylation processing apparatus included in the group of processing apparatuses shown in FIG. 4.

Next, the silylation processing apparatus 206 that performs the silylation process corresponding to the surface modification process of the amorphous carbon film will be described as follows. FIG. 6 is a schematic cross-sectional view of a structure of the silylation processing apparatus 206. The silylation processing apparatus 206 includes a chamber 51 that receives the semiconductor wafer W, and the chamber 51 includes a fixed lower container 51a and a lid 51b covering the lower chamber 51a. The lid 51b is freely elevated by an elevation apparatus (not shown). A hot plate 52 is formed in the lower container 51a so that the vapor of one of the above silylating agents may be supplied from a peripheral portion of the hot plate 52 into the chamber 51. The silylating agent is vaporized into a silylating agent vapor by a vaporizer 53, and then, the silylating agent vapor is carried by $N_2$ gas to be supplied into the chamber 51.

A heater 52a is buried in the hot plate 52, and when the heater 52a is supplied with electricity by a heater power source (not shown), a temperature may be adjusted within a range of room temperature to about 200° C., and pins 54 for supporting the semiconductor wafer W are formed on a surface of the hot plate 52. Since the semiconductor wafer W is not directly placed on the hot plate 52, contamination of a rear surface of the semiconductor wafer W is prevented. A first seal ring 55 is formed on an upper surface of an outer circumference of the lower container 51a, and a second seal ring 56 that contacts the first seal ring 55 when the lid 51b is pressed down to the lower container 51a is formed on a lower surface of an outer circumference of the lid 51b. Two pairs of the first and second seal rings 55 and 56 are formed on inner and outer portions, and a space between the two pairs of the first and second seal rings 55 and 56 may be depressurized so that an air tightness of the chamber 51 may be ensured by depressurizing the space. An exhaust port 57 for evacuating the silylating agent and nitrogen gas supplied in the chamber 51 is formed on an approximately center portion of the lid 51b, and the exhaust port 57 is connected to a vacuum pump 59 via a pressure adjusting apparatus 58.

Each of the components of the silylation processing apparatus 206 is connected to a apparatus controller 60 that is connected to the process controller 211. In addition, each of the components of the silylation processing apparatus 206 is controlled by the apparatus controller 60 based on commands of the process controller 211.

In the silylation processing apparatus 206 configured as described above, the lid 51b is elevated, and the semiconductor wafer W is transferred into the chamber 51 to be placed on the pins 54 of the hot plate 52. Then, the lid 51b descends to make an inner space of the chamber 51 sealed, and additionally, the inner space of the chamber 51 is depressurized to increase the air tightness. In the above state, the temperature of the hot plate 52 is controlled to a predetermined temperature within the range of room temperature to 200° C., a temperature of the vaporizer 53 is controlled to a range of room temperature to 50° C., silylating agent and $N_2$ gas (purge gas) are supplied with a flow of, for example, 0.1 to 1.0 g/min and a flow of, for example, 1 to 10 L/min, and a processing pressure is 666 to 96000 Pa (5 to 720 Torr). In this state, a silylation process is performed for about one minute. Accordingly, the vapor of the silylating agent is supplied onto the amorphous carbon film formed on the semiconductor wafer W and thus causes the silylation reaction on the surface of the amorphous carbon film, thereby forming a surface-modified layer.

Since the surface-modified layer on which the OH group does not substantially exist is formed by performing the above-described surface modification process, degradation of the adhesion between the amorphous carbon film and the Cu-diffusion barrier layer formed on the amorphous carbon film can be prevented, and at the same time, the permittivity of the amorphous carbon film, which is increased by the existence of the OH group, may be recovered to about 2.7.

In addition, the present invention is not limited to the above embodiments, and various changes may be made therein. For example, although the silylation process is illustrated as the surface modification process of the amorphous carbon film in the above embodiment, any kind of process may be performed as long as it can modify the surface of the amorphous carbon film. For example, a method for exposing the amorphous carbon film to a heating and reducing atmosphere may be used as another surface modification process. Here, a silicon hydride gas such as silane ($SiH_4$) may be used as a reduction gas (atmosphere). For example, in the above-described amorphous carbon film forming apparatus 201, the semiconductor wafer W is placed on the susceptor 22 that is maintained to a predetermined temperature within a range of room temperature to 350° C., and a silane gas, for example, is supplied from the shower head 30 to bring the surface of the amorphous carbon film into contact with the silicon hydride gas. When the amorphous carbon film fabricated through the above processes is examined using an ESCA (X-ray photoelectron spectroscopy), a spectrum of a Si—C bond is shown, and thus, it is considered that the OH group attached on the amorphous carbon film reacts with the silicon hydride gas as follows.

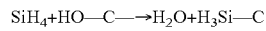

$$SiH_4 + HO\text{—}C \rightarrow H_2O + H_3Si\text{—}C$$

Figure 7:
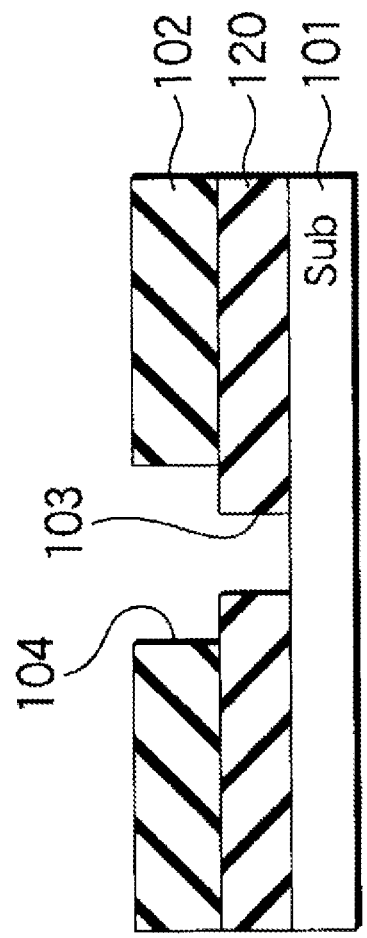
FIG. 7 is a cross-sectional view showing another example of application of the amorphous carbon film processing method according to the embodiment of the present invention.
Figure 8:
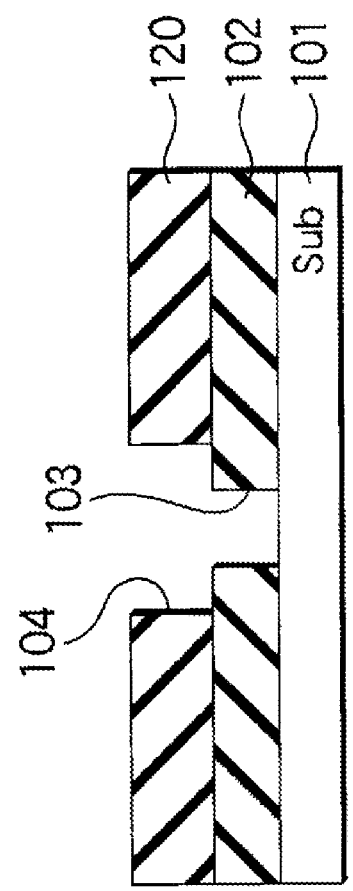
FIG. 8 is a cross-sectional view showing another example of application of the amorphous carbon film processing method according to the embodiment of the present invention.

In addition, in the above embodiment, the amorphous carbon film is used as an interlayer insulation film, and the interlayer insulation film only includes the amorphous carbon film. However, as shown in FIG. 7 or 8, the present invention may be applied to a case where a different low-k film 120 such as SiOC family or the like is stacked. Also, the present invention may be equally applied to a case where the amorphous carbon film is used as films other than an interlayer insulation film, for example, as a Cu-diffusion barrier film and the like. In addition, in the above embodiment, the hole and the trench are formed by dry-etching. However, one of the hole and trench may be formed, and the hole and trench may be formed by any other etching process.

Also, although the semiconductor wafer is illustrated as the object to be processed in the above embodiment, the present invention may be applied to other substrates, for example, glass substrates for flat panel displays (FPDs) of which a liquid crystal display (LCD) is representative.

The invention claimed is:

1. A method for processing an amorphous carbon film after dry-etching the amorphous carbon film which has been formed on a substrate, the method comprising:
    performing a wet-cleaning process on a surface of the amorphous carbon film which has been etched; and
    performing a surface modification process on the surface of the amorphous carbon film on which the wet-cleaning process has been performed,
    wherein the surface modification process is a process for bringing a silicon hydride gas not having silazane bonds into contact with the amorphous carbon film.

2. The method of claim 1, further comprising removing an oxide film from the surface of the wet-cleaned amorphous carbon film, before modifying the surface of the amorphous carbon film.

3. A semiconductor device manufacturing method comprising:
    forming an interlayer insulation film including an amorphous carbon film on a semiconductor substrate;
    forming a hole or a trench by performing dry-etching on the interlayer insulation film;
    performing a wet-cleaning process on a surface of the amorphous carbon film on which the dry-etching has been performed;
    performing a surface modification process on the surface of the amorphous carbon film on which the wet-cleaning process has been performed;
    forming a barrier film on the amorphous carbon film on which the surface modification process has been performed; and
    burying a wiring metal in the hole or the trench,
    wherein the surface modification process is a process for bringing a silicon hydride gas not having silazane bonds into contact with the amorphous carbon film.

4. The semiconductor device manufacturing method of claim 3, wherein further comprising removing an oxide film from the surface of the wet-cleaned amorphous carbon film, before modifying the surface of the amorphous carbon film.

5. A non-transitory computer readable storage medium having recorded thereon a program for operating on a computer and controlling a processing apparatus, wherein the program controls the processing apparatus in the computer so as to execute a method for processing an amorphous carbon film, the method comprises:

performing a wet-cleaning process on a surface of the amorphous carbon film which has been etched; and performing a surface modification process on the surface of the amorphous carbon film on which the wet-cleaning process has been performed, wherein the surface modification process is a process for bringing a silicon hydride gas not having silazane bonds into contact with the amorphous carbon film.

6. The method of claim 1, wherein the silicon hydride gas is silane.

7. The semiconductor device manufacturing method of claim 3, wherein the silicon hydride gas is silane.

8. The non-transitory computer readable storage medium of claim 5, wherein the silicon hydride gas is silane.

* * * * *